United States Patent
Khatri et al.

(10) Patent No.: US 9,106,072 B2
(45) Date of Patent: Aug. 11, 2015

(54) ELECTROSTATIC DISCHARGE PROTECTION OF AMPLIFIER CASCODE DEVICES

(71) Applicant: QUALCOMM Incorporated, San Diego, CA (US)

(72) Inventors: Himanshu Khatri, Laguna Niguel, CA (US); Ojas M Choksi, San Diego, CA (US); Wei Zhuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 13/720,836

(22) Filed: Dec. 19, 2012

(65) Prior Publication Data

US 2014/0167862 A1 Jun. 19, 2014

(51) Int. Cl.
H03F 1/52 (2006.01)
H02H 9/04 (2006.01)
H03F 1/22 (2006.01)

(52) U.S. Cl.
CPC .............. *H02H 9/043* (2013.01); *H03F 1/223* (2013.01); *H03F 1/52* (2013.01); *H03F 1/523* (2013.01)

(58) Field of Classification Search
CPC .................................... H03F 1/52; H03F 3/04
USPC ........................ 330/298, 207 P, 296, 285, 277
See application file for complete search history.

(56) References Cited

U.S. PATENT DOCUMENTS

| | | | | |
|---|---|---|---|---|
| 4,250,463 | A * | 2/1981 | Foster | 330/298 |
| 5,382,916 | A * | 1/1995 | King et al. | 330/253 |
| 6,496,074 | B1 * | 12/2002 | Sowlati | 330/311 |
| 6,498,533 | B1 * | 12/2002 | Sowlati | 330/98 |
| 7,027,276 | B2 | 4/2006 | Chen | |
| 7,541,875 | B2 | 6/2009 | Taylor et al. | |
| 7,760,029 | B2 * | 7/2010 | Sutardja | 330/311 |
| 7,812,672 | B2 | 10/2010 | Lee et al. | |
| 7,835,121 | B2 | 11/2010 | Tiebout et al. | |
| 8,354,889 | B2 * | 1/2013 | Karthaus | 330/297 |
| 8,558,288 | B2 * | 10/2013 | Rothberg et al. | 257/253 |
| 2002/0196086 | A1 * | 12/2002 | Sowlati | 330/311 |
| 2005/0110574 | A1 * | 5/2005 | Richard et al. | 330/297 |
| 2007/0058308 | A1 | 3/2007 | Thijs et al. | |
| 2007/0070564 | A1 | 3/2007 | Ma et al. | |
| 2011/0176245 | A1 | 7/2011 | Worley et al. | |
| 2012/0032743 | A1 | 2/2012 | Hsieh et al. | |

OTHER PUBLICATIONS

International Search Report and Written Opinion—PCT/US2013/076715—ISA/EPO—Mar. 19, 2014.

(Continued)

*Primary Examiner* — Henry Choe
(74) *Attorney, Agent, or Firm* — Ramin Mobarhan

(57) ABSTRACT

Exemplary embodiments are directed to providing electrostatic discharge (ESD) protection of a cascode device of an amplifier. In an exemplary embodiment, a transistor is configured to receive a bias voltage and at least one circuit element coupled to the transistor and configured to receive an input voltage via an input pad. Additionally at least one diode can be coupled to a drain of the first transistor and configured to limit a voltage potential at an internal node of the amplifier caused by the input pad.

25 Claims, 7 Drawing Sheets

(56) References Cited

OTHER PUBLICATIONS

Thijs S et al: "Implementation of plug-and-play ESD protection in 5.5GHz 90nm RF CMOS LNAs—Concepts, constraints and solutions" Microelectronics and Reliability, Elsevier Science Ltd, GB, vol. 46, No. 5-6, May 1, 2006, pp. 702-712, XP025250281 ISSN: 0026-2714 [retrieved on May 11, 2006 p. 709, left-hand column, line 3—p. 711, left-hand column, line 6; figures 15, 20.

\* cited by examiner

US 9,106,072 B2

ELECTROSTATIC DISCHARGE PROTECTION OF AMPLIFIER CASCODE DEVICES

BACKGROUND

1. Field

The present invention relates generally to electrostatic discharge protection. More specifically, the present invention relates to systems, devices, and methods for electrostatic discharge protection of low-noise amplifier cascode devices.

2. Background

Amplifiers are commonly used in various electronics devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA), and the receiver and transmitter may utilize variable gain amplifiers (VGAs).

Amplifiers may be fabricated with various integrated circuit (IC) processes. Sub-micron complementary metal oxide semiconductor (CMOS) fabrication processes are commonly used for radio frequency (RF) circuits in wireless devices and other electronics devices in order to reduce cost and improve integration. However, transistors fabricated with sub-micron CMOS processes typically have small physical dimensions and are more susceptible to stress and possibly failure due to electro-static discharge (ESD). ESD is a sudden large and momentary electrical charge that may come from static electricity and/or other sources. It is desirable to effectively combat ESD while minimally affecting performance.

In a common-source cascode LNA, with an inductive load, a load tuning capacitor may exist between an output of the LNA output and a ground node. Typically, a gate of a cascode device and a supply voltage are closely coupled to the ground node through bypass capacitors. During an ESD event at an input of the LNA, due to LC resonance at the LNA output, a large voltage potential can develop between the LNA output and the gate of a cascode device, potentially rupturing the gate-drain junction of the cascode device. In an integrated receiver, the LNA output may be an internal node, which couples to a down-converter. In this case, typically, there is no ESD protection for the cascode device and, therefore, the LNA output swing may damage the cascode device, even though the transconductance transistor is undamaged.

Hence, ESD protection of LNA cascode devices is desirable. More specifically, a need exists for systems, devices, and methods for protecting LNA cascode transistor against ESD.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Various exemplary designs of an LNA with improved ESD protection circuitry are described herein. The LNA may be used for various electronics devices such as wireless and wireline communication devices, cellular phones, personal digital assistants (PDAs), handheld devices, wireless modems, laptop computers, cordless phones, Bluetooth devices, etc. For clarity, the use of the amplifier for a wireless communication device is described below. Other aspects, as well as features and advantages of various aspects, of the present invention will become apparent to those of skill in the art though consideration of the ensuing description, the accompanying drawings and the appended claims.

Figure 1:
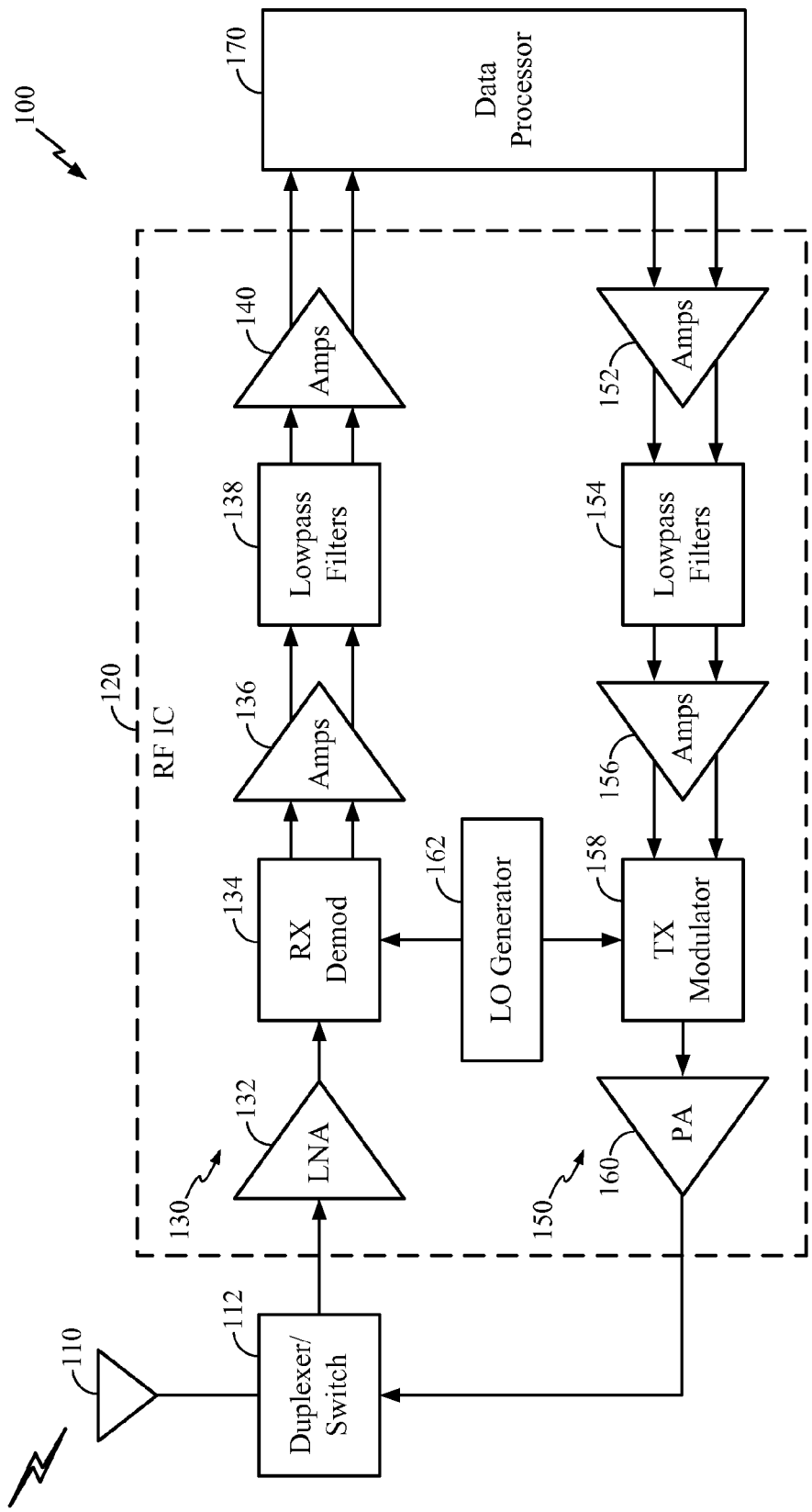
FIG. 1 is a block diagram of a wireless communication device.

FIG. 1 shows a block diagram of a wireless communication device 100, which may be a cellular phone or some other device. In the exemplary design shown in FIG. 1, wireless device 100 includes a receiver 130 and a transmitter 150 that support bi-directional communication. In general, wireless device 100 may include any number of receivers and any number of transmitters for any number of communication systems and any number of frequency bands.

In the receive path, an antenna 110 receives signals transmitted by base stations and/or other transmitter stations and provides a received RF signal, which is routed through a duplexer/switch 112 and provided to receiver 130. Within receiver 130, the received RF signal is amplified by a low noise amplifier (LNA) 132 and demodulated by a receive demodulator (RX Demod) 134 to obtain in-phase (I) and quadrature-phase (Q) down-converted signals. The down-converted signals are amplified by amplifiers (Amps) 136, filtered by lowpass filters 138, and further amplified by amplifiers 140 to obtain I and Q input baseband signals, which are provided to a data processor 170

In the transmit path, data processor 170 processes data to be transmitted and provides I and Q output baseband signals to transmitter 150. Within transmitter 150, the output baseband signals are amplified by amplifiers 152, filtered by lowpass filters 154, amplified by amplifiers 156, and modulated by a transmit (TX) modulator 158 to obtain a modulated signal. A power amplifier (PA) 160 amplifies the modulated signal to obtain a desired output power level and provides a transmit RF signal. The transmit RF signal is routed through duplexer/switch 112 and transmitted via antenna 110. A local oscillator (LO) signal generator 162 generates down-conversion LO signals for demodulator 134 in receiver 130 and up-conversion LO signals for modulator 158 in transmitter 150.

FIG. 1 shows an exemplary design of a transceiver. In general, the conditioning of the signals in a transmitter and a receiver may be performed by one or more stages of amplifier, filter, up-converter, down-converter, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted.

In the exemplary design shown in FIG. 1, receiver 130 and transmitter 150 may be implemented on an RF integrated circuit (RFIC) 120. LNA 132 and amplifier 152 may receive input signals from devices that are external to RFIC 120 and may thus have their inputs coupled to IC pins. These IC pins may be susceptible to ESD charges, which may damage the circuits coupled to the IC pins. LNA 132 and amplifier 152 may be implemented with ESD protection circuitry that can handle ESD charges coupled via the IC pins.

Figure 2:
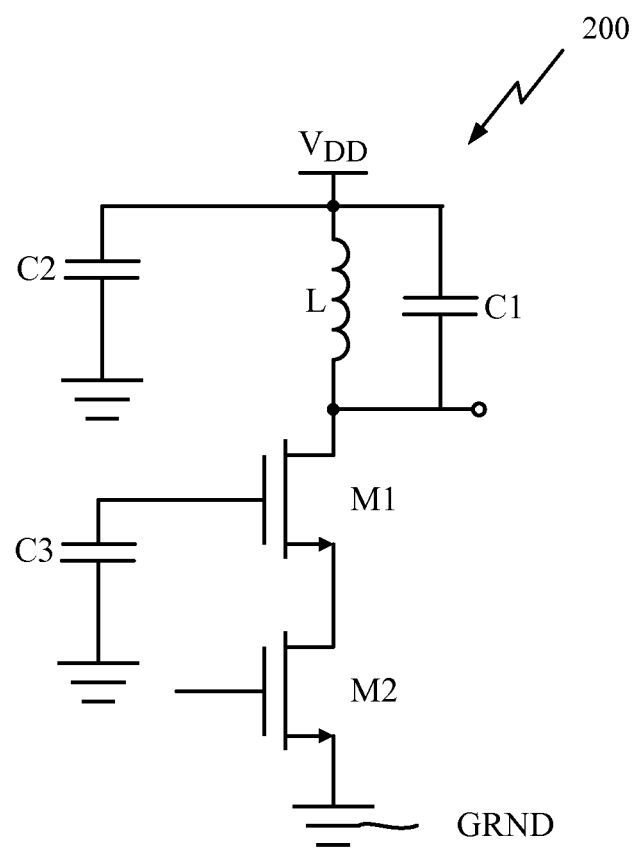
FIG. 2 illustrates an amplifier including a main transistor and a cascode transistor.

FIG. 2 illustrates an amplifier 200 including a first transistor M1, which may be referred to herein as a "cascode transistor" and a second transistor M2, which may be referred to herein as a "main transistor." As illustrated in FIG. 2, transistor M1 has a drain coupled to a supply voltage VDD via an inductor L, a source coupled to a drain of transistor M2, and a gate configured to receive a voltage (e.g., a bias voltage). Further, transistor M2 has a source coupled to a ground voltage GRND and a gate configured to receive a voltage (e.g., an input voltage) from an input pad 205 (FIGS. 5 and 7). As will be appreciated by a person having ordinary skill in the art, a conventional amplifier may also include a capacitor coupled between an output and a supply voltage for frequency tuning, a bypass capacitor C2 coupled between a supply voltage and ground voltage GRND to filter the power supply noise, and/or a bypass capacitor C3 coupled between the gate of the cascode transistor (i.e., transistor M1) and ground voltage GRND to filter the bias voltage noise.

Accordingly, during operation, the gate of the cascode transistor may follow a ground potential closely due to gate bypass capacitance, while the output node (i.e., the drain of the cascode transistor) may observe a voltage swing due to LC resonance. It is noted that an inductor load may resonate with tuning capacitance and the drain capacitance of the cascode device (i.e., transistor M1). Due to this resonance, not only is voltage transient higher at the drain of the cascode device relative to $V_{DD}$, but also it may experience a phase delay. During an ESD event at the LNA input port, this LNA output swing with respect to the cascode transistor gate may become large enough to damage the cascode device, while the main transistor may remain intact.

Figure 3:
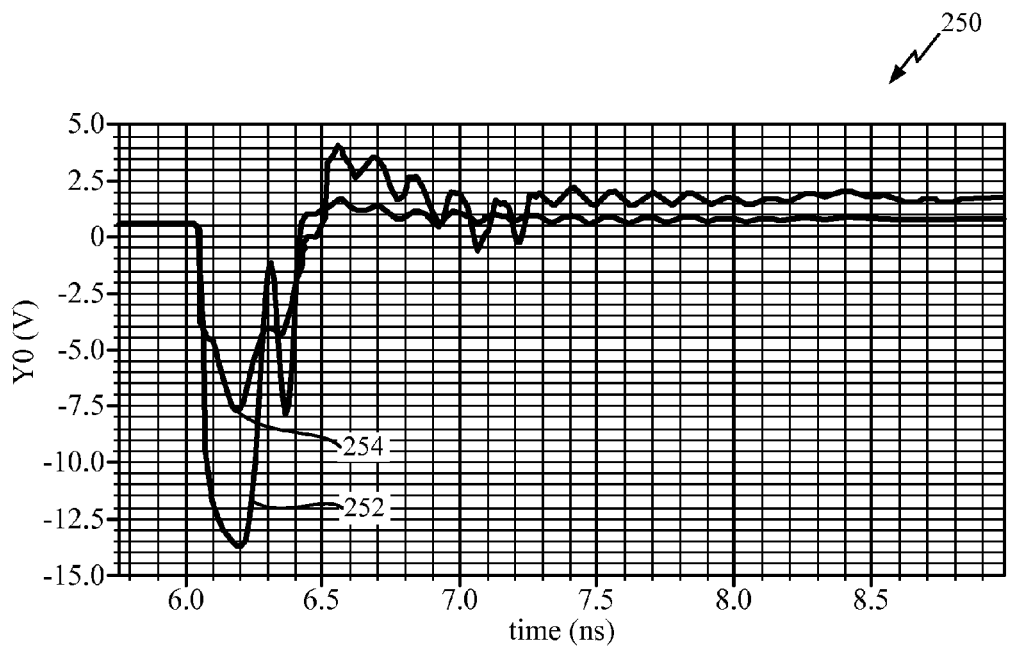
FIG. 3 is a plot illustrating gate-to-drain voltages of a cascode transistor and a main transistor of a low-noise amplifier.

FIG. 3 is a plot 250 illustrating simulated gate-to-drain voltages of a cascode transistor (e.g., transistor M1 of FIG. 2) and a main transistor (e.g., transistor M2 of FIG. 2) of an LNA (e.g., amplifier 200 of FIG. 2) during a negative charge device model (CDM) ESD event at an LNA input. Waveform 252 illustrates a gate-to-drain voltage of a cascode transistor of the LNA amplifier and waveform 254 illustrates a gate-to-drain voltage of a main transistor of the LNA amplifier. As illustrated in plot 250, the gate-to-drain voltage of a cascode transistor includes a relatively large voltage spike, which may cause damage to the cascode transistor. In this particular case, the transistors were capable of handling approximately 7.5V across their terminals for a short duration without damage. Thus, in the illustrated case, the main transistor remained intact, while the cascode transistor was damaged.

Figure 4:
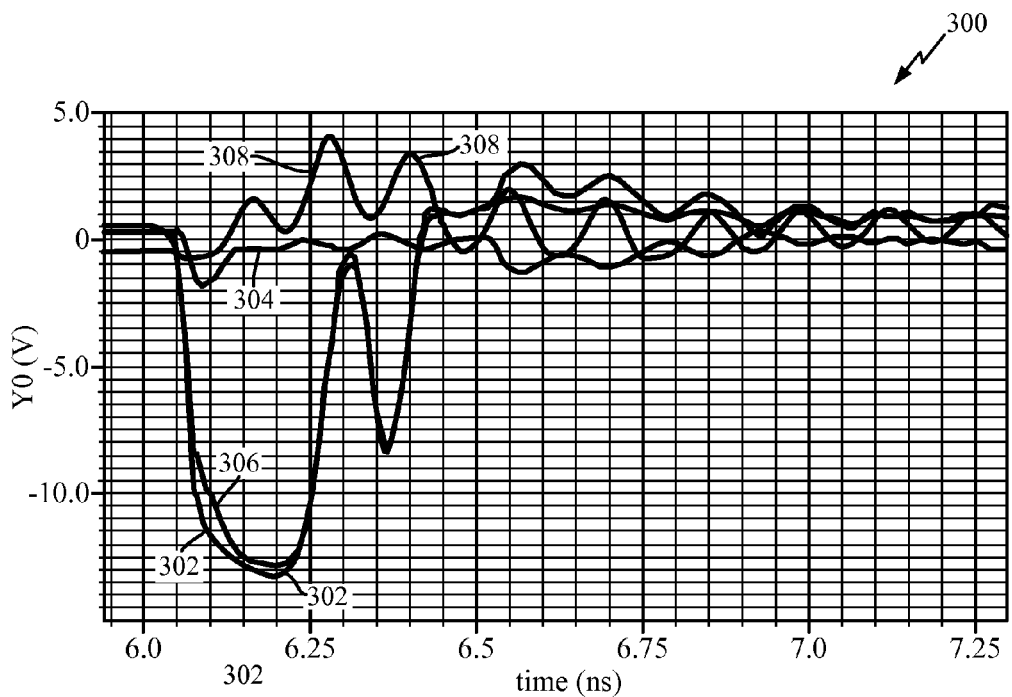
FIG. 4 is a plot illustrating various voltages levels during operation of a low-noise amplifier.

FIG. 4 is a plot 300 illustrating various example voltages during a negative CDM ESD event of an LNA (e.g., amplifier 200 of FIG. 2). Waveform 302 illustrates a gate-to-drain voltage of a cascode transistor, waveform 304 illustrates gate voltage of the cascode transistor relative to the supply voltage ($Vg_{cascode}-V_{DD}$), waveform 306 illustrates the drain voltage of the cascode transistor with respect to the supply voltage ($V_{DD}-Vd_{cascode}$), and waveform 308 illustrates the supply voltage relative to the ground voltage ($V_{DD}-GRND$). As will be appreciated by a person having ordinary skill in the art, a gate voltage of the cascode transistor follows the supply voltage relatively closely, and the supply voltage follows the ground voltage GRND relatively closely. However, the drain voltage of the cascode transistor deviates from both of the supply voltage $V_{DD}$ and the ground voltage GRND due to voltage drop across inductor L.

Figure 5A:
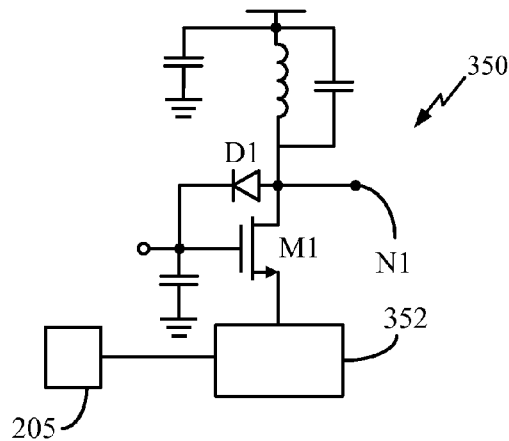
FIGS. 5A-5E illustrate various devices having a diode coupled to a drain of a cascode transistor, according to various exemplary embodiments of the present invention.

FIG. 5A illustrates a device 350 configured for ESD protection of a cascode device, according to an exemplary embodiment of the present invention. Device 350, which may comprise an LNA, includes a cascode transistor M1 coupled to a circuit element 352. Circuit element 352 is configured to receive a voltage (e.g., an input voltage) via input pad 205. According to one exemplary embodiment, circuit element 352 may comprise a transistor. A drain of cascode transistor M1 is coupled to a node N1 and gate of cascode transistor M1 is configured to receive a voltage (e.g., a bias voltage). Device 350 also includes a diode D1 coupled between the drain of cascode transistor M1 and the gate of cascode transistor M1. It is noted that node N1 may be an internal node (i.e., node N1 may not be directly coupled to an input/output (I/O) pad). It is further noted that device 350 may include one or more bypass coupling capacitors and an LC load at the output, as disclosed above with reference to FIG. 2.

In this exemplary embodiment, a cathode of diode D1 is coupled to the gate of cascode transistor M1 and an anode of diode D1 is coupled to the drain of cascode transistor M1. During a CDM event, as voltage develops across the drain and gate of cascode transistor M1, diode D1 begins to conduct and thus discharges node N1 before a sufficiently large voltage can develop across the drain and gate. Therefore, diode D1 effectively clamps the voltage across the gate-drain terminals of the transistor M1. Accordingly, diode D1, as configured in device 350, may limit a gate-to-drain voltage of cascode transistor M1 during, for example, an ESD event caused by input pad 205. Therefore, in accordance with an exemplary embodiment of the present invention, device 350 is configured to protect an internal node (i.e., node N1) of device 350. More specifically, according to one exemplary embodiment, diode D1 provides ESD protection for an internal node of device 350. However, diode D1 may also turn on during normal operations when there is a large swing at the output of device 350. This may degrade the performance of device 350, especially linearity, because it can clip the voltage swing.

Figure 5B:
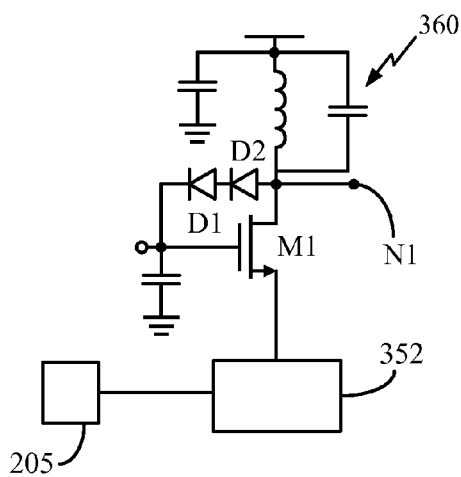

FIG. 5B illustrates a device 360 configured for ESD protection of a cascode device, according to an exemplary embodiment of the present invention. Device 360, which may comprise an LNA, includes a cascode transistor M1 coupled to circuit element 352. Circuit element 352, which is configured to receive a voltage (e.g., an input voltage) via input pad 205, may comprise, for example only, a transistor. The drain of cascode transistor M1 is coupled to node N1 and the gate of cascode transistor M1 is configured to receive a voltage (e.g., a bias voltage). Device 360 also includes diode D1 and a second diode D2 coupled between the drain of cascode transistor M1 and the gate of cascode transistor M1. As noted above, node N1 may be an internal node (i.e., node N1 may not be directly coupled to an input/output (I/O) pad). Further, device 360 may include one or more bypass coupling capacitors and an LC load at an output, as disclosed above with reference to FIG. 2.

In this exemplary embodiment, the cathode of diode D1 is coupled to the gate of cascode transistor M1 and an anode of diode D1 is coupled to a cathode of diode D2. Further, an anode of diode D2 is coupled to the drain of cascode transistor M1. As a voltage develops across the drain and gate of cascode transistor M1, diodes D1 and D2 begin to conduct, thus, discharging node N1. Accordingly, diodes D1 and D2, as configured in device 360, may limit a gate-to-drain voltage of cascode transistor M1 during, for example, an ESD event caused by input pad 205. Therefore, in accordance with an exemplary embodiment of the present invention, device 360 is configured for protecting an internal node (i.e., node N1) of device. More specifically, according to one exemplary embodiment, diodes D1 and D2 provide ESD protection for an internal node of device 360. It is noted that, due to the cascaded diodes, as compared to device 350, a much larger voltage (i.e., twice the voltage), may develop across the drain and gate of cascode transistor M1, which will reduce its negative CDM ESD performance. Further, as compared to device 350, during normal operation, a much larger voltage swing may be tolerated at the output of device 360 before diodes D1 and D2 start to clip. Thus, device 360 may exhibit improved linearity compared to device 350.

Figure 5C:
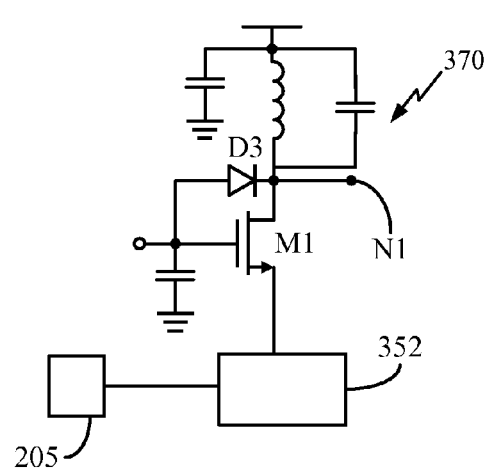

FIG. 5C illustrates a device 370 configured for ESD protection of a cascode device, according to an exemplary embodiment of the present invention. Device 370, which may comprise an LNA, includes cascode transistor M1 coupled to circuit element 352. Circuit element 352 is configured to receive a voltage (e.g., an input voltage) via input pad 205. As previously noted, circuit element 352 may comprise, for example only, a transistor. The drain of cascode transistor M1 is coupled to node N1 and the gate of cascode transistor M1 is configured to receive a voltage (e.g., a bias voltage). Device 370 also includes a diode D3 coupled between the drain of cascode transistor M1 and the gate of cascode transistor M1. As noted above, node N1 may be an internal node. Further, device 370 may include one or more bypass coupling capacitors and an LC load at an output, as disclosed above with reference to FIG. 2.

In this exemplary embodiment, an anode of diode D3 is coupled to the gate of cascode transistor M1 and a cathode of diode D3 is coupled to the drain of cascode transistor M1. Upon a voltage across the drain and gate of cascode transistor M1 increasing above a reverse breakdown voltage of diode D3, diode D3 begins to conduct. Thus, diode D3 maintains the voltage at its reverse breakdown voltage and discharges node N1. Accordingly, diode D3, as configured in device 370, may limit a gate-to-drain voltage of cascode transistor M1 during, for example, an ESD event caused by input pad 205. Therefore, in accordance with an exemplary embodiment of the present invention, device 370 is configured to protecting an internal node (i.e., node N1) of device. More specifically, according to one exemplary embodiment, diode D3 provides ESD protection for an internal node of device 370. Similar to device 360, this has little impact on the LNA linearity during normal operations.

Figure 5D:
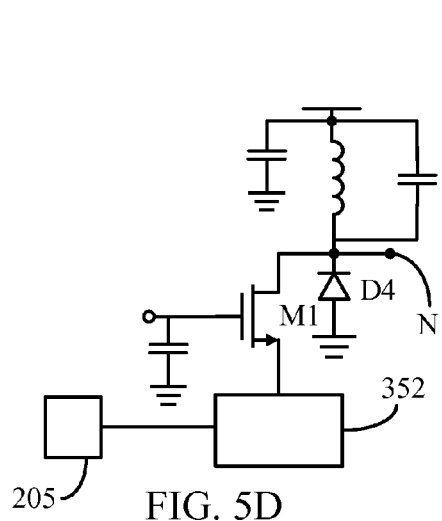

FIG. 5D illustrates a device 380 configured for ESD protection of a cascode device, according to an exemplary embodiment of the present invention. Device 380, which may comprise an LNA, includes cascode transistor M1 coupled to circuit element 352, which is configured to receive a voltage (e.g., an input voltage) via input pad 205. The drain of cascode transistor M1 is coupled to node N1 and the gate of cascode transistor M1 is configured to receive a voltage (e.g., a bias voltage). Device 380 also includes a diode D4 coupled between the drain of cascode transistor M1 and a reference voltage, which may comprise a ground voltage GRND. As previously above, node N1 may be an internal node. Further, device 380 may include one or more bypass coupling capacitors and an LC load at an output, as disclosed above with reference to FIG. 2.

In this exemplary embodiment, an anode of diode D4 is coupled to ground voltage GRND and a cathode of diode D4 is coupled to the drain of cascode transistor M1. When the drain voltage of transistor M1 exceeds the reverse breakdown voltage limit of diode D4, diode D4 begins to conduct and limits the voltage swing between the node N1 and ground voltage GRND, which is closely followed by gate voltage of cascode transistor M1 due to a bypass capacitor (not shown in FIG. 5D). Therefore, the drain-gate voltage is limited. Accordingly, diode D4, as configured in device 380, may limit a gate-to-drain voltage of cascode transistor M1 during, for example, an ESD event caused by input pad 205. Therefore, in accordance with an exemplary embodiment of the present invention, device 380 is configured to protecting an internal node (i.e., node N1) of device. More specifically, according to one exemplary embodiment, diode D4 provides ESD protection for an internal node of device 380.

Figure 5E:
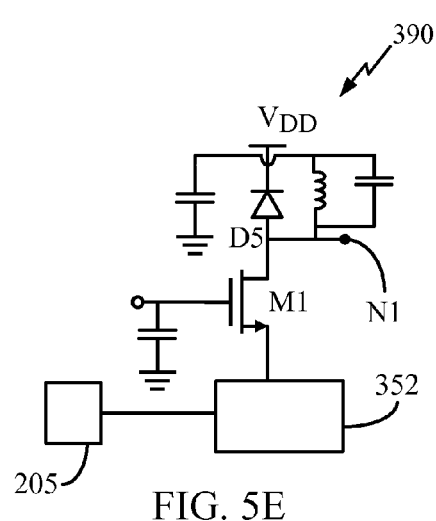

FIG. 5E illustrates a device 390 configured for ESD protection of a cascode device, according to an exemplary embodiment of the present invention. Device 390, which may comprise an LNA, includes cascode transistor M1 coupled to circuit element 352, which is configured to receive a voltage (e.g., an input voltage) via input pad 205. The drain of cascode transistor M1 is coupled to node N1 and the gate of cascode transistor M1 is configured to receive a voltage (e.g., a bias voltage). Device 390 also includes a diode D5 coupled between the drain of cascode transistor M1 and a supply voltage $V_{DD}$. Node N1 may be an internal node, as disclosed above. In addition, device 390 may include one or more bypass coupling capacitors and an LC load at the output, as disclosed above with reference to FIG. 2.

In this exemplary embodiment, a cathode of diode D5 is coupled to supply voltage and an anode of diode D5 is coupled to the drain of cascode transistor M1. Diode D5 may force node N1 to follow supply voltage $V_{DD}$, which is closely coupled to ground voltage GRND, due to supply bypass capacitors. As in the earlier case, ground voltage GRND is also coupled to a gate of cascode transistor M1 through filtering capacitors at the gate of cascode transistor M1. Accordingly, diode D5, as configured in device 390, may limit a gate-to-drain voltage of cascode transistor M1 during, for example, an ESD event caused by input pad 205. Therefore, in accordance with an exemplary embodiment of the present invention, device 390 is configured to protecting an internal node (i.e., node N1) of device. More specifically, according to one exemplary embodiment, diode D5 provides ESD protection for an internal node of device 390.

Figure 6:
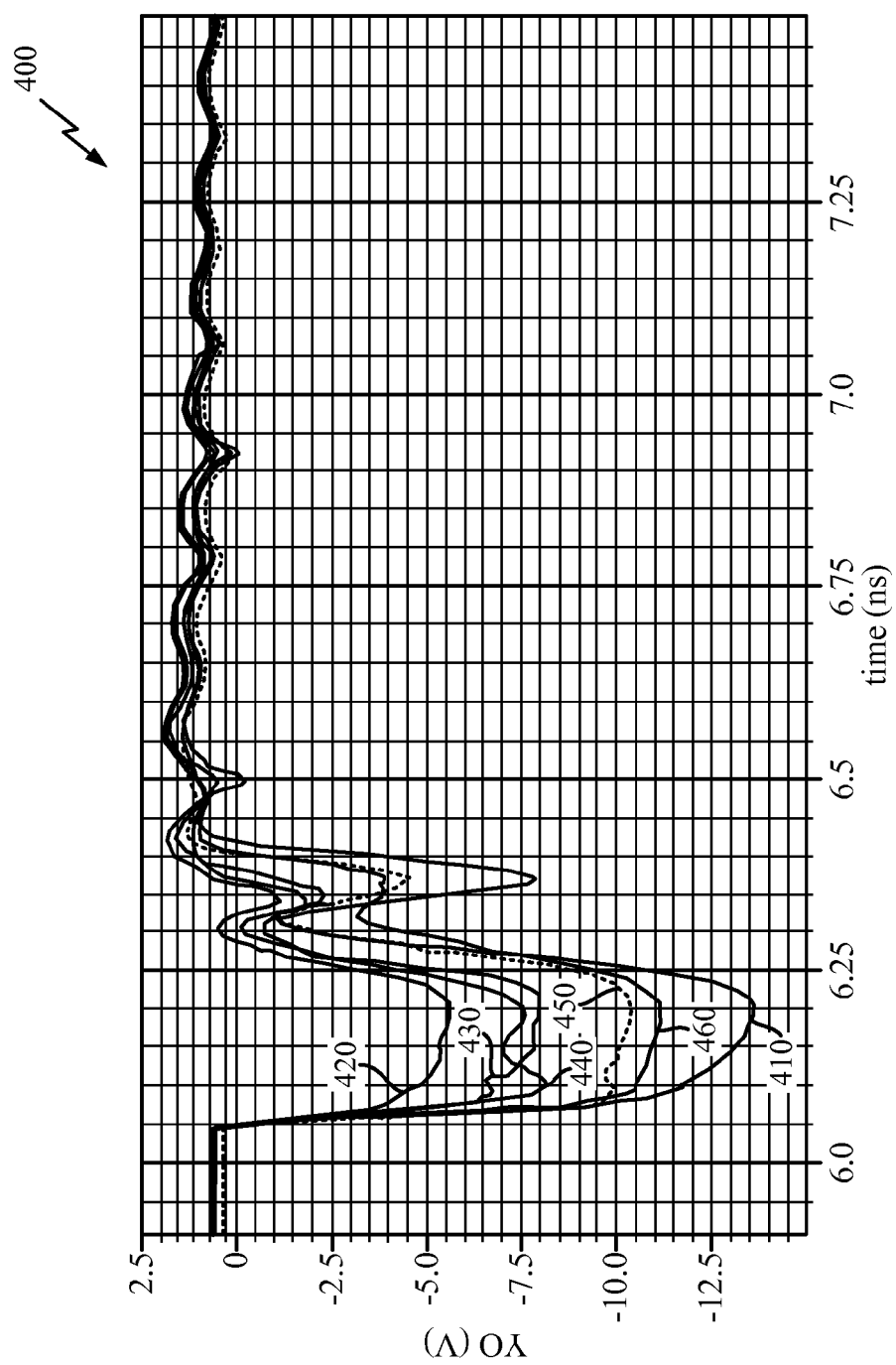
FIG. 6 is a plot illustrating gate-to-drain voltages of cascode transistors of the devices illustrated in FIGS. 5A-5E.

FIG. 6 is a plot 400 illustrating gate-to-drain voltages of cascode transistors of devices 350, 360, 370, 380, and 390 and a gate-to-drain voltage of cascode transistor without cascode ESD protection during a CDM ESD event. More specifically, waveform 410 depicts a gate-to-drain voltage of a cascode transistor without any cascode protection, waveform 420 depicts a gate-to-drain voltage of a cascode transistor of device 350 (i.e., having a diode coupled between a drain and a gate of the cascaded transistor), waveform 430 depicts a gate-to-drain voltage of a cascode transistor of device 360 (i.e., having a plurality of diodes coupled between a drain and a gate of the cascaded transistor), waveform 440 depicts a gate-to-drain voltage of a cascode transistor of device 370 (i.e., having a diode coupled between a drain and a gate of the cascaded transistor), waveform 450 depicts a gate-to-drain voltage of a cascode transistor of device 380 (i.e., having a diode coupled between a drain of the cascaded transistor and a ground voltage), and waveform 460 depicts a gate-to-drain voltage of a cascode transistor of device 390 (i.e., having a diode coupled between a drain of the cascaded transistor and a supply voltage).

As illustrated in plot 400, in this example, a gate-to-drain voltage of a cascode transistor without any cascode protection has a voltage spike of over 12.5 volts, a gate-to-drain voltage of a cascode transistor of device 380 has a voltage spike of approximately 11.0 volts, a gate-to-drain voltage of a cascode transistor of device 370 has a voltage spike of approximately 10.0 volts, a gate-to-drain voltage of a cascode transistor of device 390 and a gate-to-drain voltage of the cascode transistor of device 360 each have a voltage spike of approximately 8.0 volts, and a gate-to-drain voltage of a cascode transistor of device 350 has a voltage spike of approximately 5.5 volts. It is noted although device 350 provides for optimal ESD protection, depending upon a voltage swing at an output of device 350, diode D1 may become forward biased and may impact noise and linearity performances.

Figure 7A:
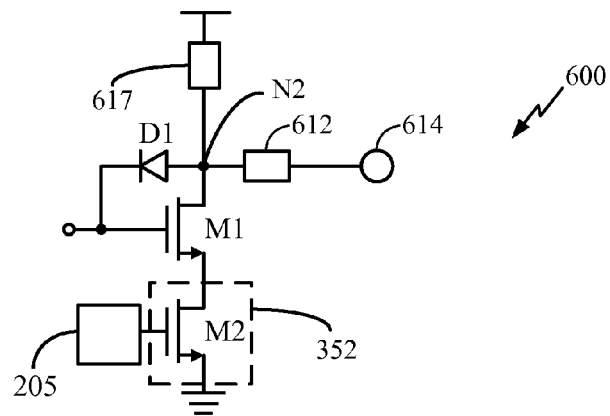
FIGS. 7A-7E illustrate various devices having a diode coupled to a drain of a cascode transistor and at least one circuit element coupled between the drain of the cascode transistor and an output pad, in accordance with various exemplary embodiments of the present invention.

FIG. 7A illustrates a device 600 including configured for ESD protection of a cascode device, according to an exemplary embodiment of the present invention. Device 600 includes a load 617, cascode transistor M1 and circuit element 352. In this exemplary embodiment, circuit element 352 comprises a main transistor M2, wherein a source of cascode transistor M1 is coupled to a drain of main transistor M2. Further, a source of main transistor M2 is coupled to reference voltage (e.g., a ground voltage GRND) and a gate of main transistor M2 is configured to receive a voltage (e.g., an input voltage) via input pad 205. It is noted that the source of transistor M2 need not be directly coupled to the ground voltage, rather, a circuit element (e.g., a resistor or and inductor) may exist between the source of transistor M2 and the ground voltage. A drain of cascode transistor M1 is coupled to a node N2, which comprises an internal node. Further, the gate of cascode transistor M1 is configured to receive a voltage (e.g., a bias voltage). Device 600 also includes a diode D1 coupled between the drain of cascode transistor M1 and the gate of cascode transistor M1. In this exemplary embodiment, a cathode of diode D1 is coupled to the gate of cascode transistor M1 and an anode of diode D1 is coupled to the drain of cascode transistor M1.

According to an exemplary embodiment of the present invention, device 600 may include at least one circuit element 612 coupled between node N2 and an output pad 614. By way of example only, circuit element 612 may comprise an inductor, a capacitor, a mixer, a matching network, or any combination thereof. Accordingly, the drain of cascode transistor M1 of device 600 may not be directly coupled to output pad 614.

Figure 7B:
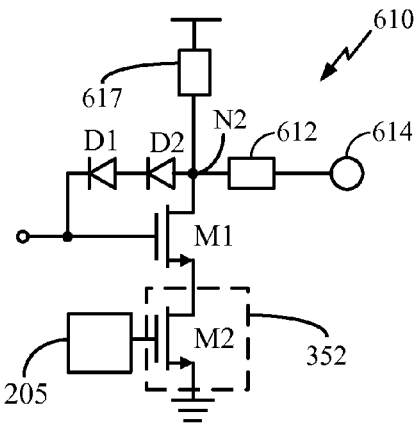

FIG. 7B illustrates a device 610 including configured for ESD protection of a cascode device, according to an exemplary embodiment of the present invention. Device 610 includes load 617, cascode transistor M1 and circuit element 352. In this exemplary embodiment, circuit element 352 comprises main transistor M2, wherein the source of cascode transistor M1 is coupled to the drain of main transistor M2. Further, the source of main transistor M2 is coupled to a reference voltage (e.g., a ground voltage GRND) and the gate of main transistor M2 is configured to receive a voltage (e.g., an input voltage) via input pad 205. The drain of cascode transistor M1 is coupled to node N2, which comprises an internal node. Further, the gate of cascode transistor M1 is configured to receive a voltage (e.g., a bias voltage). Device 610 also includes diode D1 and a second diode D2 coupled between the drain of cascode transistor M2 and the gate of cascode transistor M2. In this exemplary embodiment, the cathode of diode D1 is coupled to the gate of cascode transistor M1 and an anode of diode D1 is coupled to a cathode of diode D2. Further, an anode of diode D2 is coupled to the drain of cascode transistor M1. Device 610 further includes at least one circuit element 612 coupled between node N2 and output pad 614. Accordingly, the drain of cascode transistor M1 of device 610 may not be directly coupled to output pad 614.

Figure 7C:
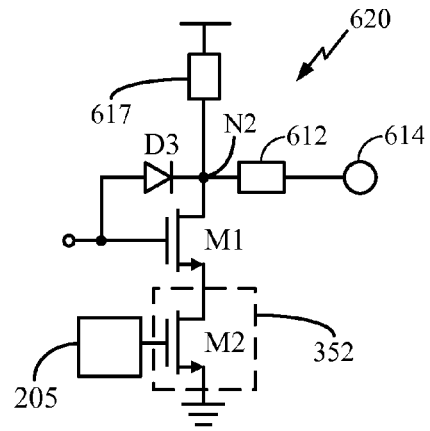

FIG. 7C illustrates a device 620 including configured for ESD protection of a cascode device, according to an exemplary embodiment of the present invention. Device 620 includes load 617, cascode transistor M1 and circuit element 352. In this exemplary embodiment, circuit element 352 comprises main transistor M2, wherein the source of cascode transistor M1 is coupled to the drain of main transistor M2. Further, the source of main transistor M2 is coupled to a reference voltage (e.g., a ground voltage GRND) and the gate of main transistor M2 is configured to receive a voltage (e.g., an input voltage) via input pad 205. A drain of cascode transistor M1 is coupled to node N2, which comprises an internal node. Further, the gate of cascode transistor M1 is configured to receive a voltage (e.g., a bias voltage). Device 620 also includes a diode D3 coupled between the drain of cascode transistor M1 and the gate of cascode transistor M1. In this exemplary embodiment, an anode of diode D3 is coupled to the gate of cascode transistor M1 and a cathode of diode D3 is coupled to the drain of cascode transistor M1. Furthermore, device 620 includes at least one circuit element 612 coupled between node N2 and an output pad 614. Accordingly, the drain of cascode transistor M1 of device 620 may not be directly coupled to output pad 614.

Figure 7D:
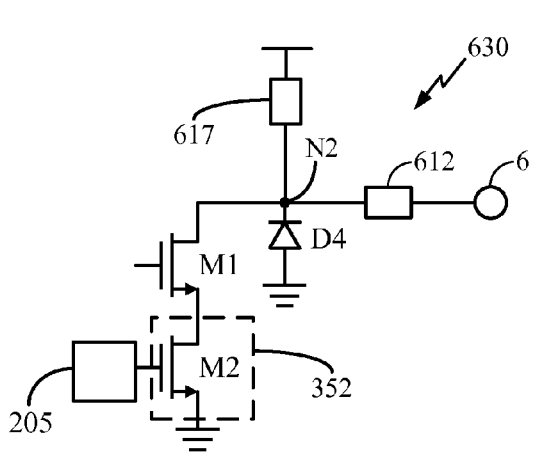

FIG. 7D illustrates a device 630 including configured for ESD protection of a cascode device, according to an exemplary embodiment of the present invention. Device 630 includes load 617, cascode transistor M1 and circuit element 352. In this exemplary embodiment, circuit element 352 comprises main transistor M2, wherein the source of cascode transistor M1 is coupled to the drain of main transistor M2. Further, the source of main transistor M2 is coupled to a reference voltage (e.g., a ground voltage GRND) and the gate of main transistor M2 is configured to receive a voltage (e.g., an input voltage) via input pad 205. A drain of cascode transistor M1 is coupled to node N2, which comprises an internal node. Further, the gate of cascode transistor M1 is configured to receive a voltage (e.g., a bias voltage). Device 630 also includes a diode D4 coupled between the drain of cascode transistor M1 and a reference voltage, which may comprise a ground voltage GRND. In this exemplary embodiment, an anode of diode D4 is coupled to ground voltage GRND and a cathode of diode D4 is coupled to the drain of cascode transistor M1. Moreover, device 630 includes at least one circuit element 612 coupled between node N2 and an output pad 614. Accordingly, the drain of cascode transistor M1 of device 630 may not be directly coupled to output pad 614.

Figure 7E:
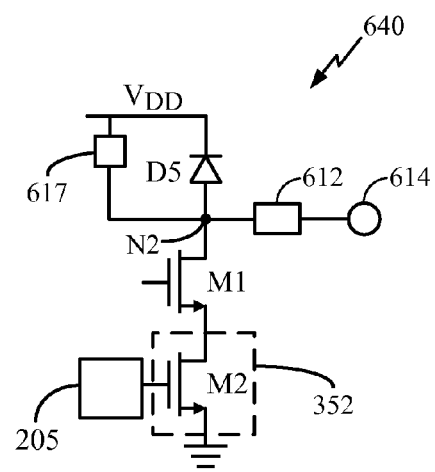

FIG. 7E illustrates a device 640 including configured for ESD protection of a cascode device, according to an exemplary embodiment of the present invention. Device 640 includes load 617, cascode transistor M1 and circuit element 352. In this exemplary embodiment, circuit element 352 comprises main transistor M1, wherein the source of cascode transistor M1 is coupled to the drain of main transistor M2. Further, the source of main transistor M2 is coupled to a reference voltage (e.g., a ground voltage GRND) and the gate of main transistor M2 is configured to receive a voltage (e.g., an input voltage) via input pad 205. A drain of cascode transistor M1 is coupled to node N1, which comprises an internal node. Further, the gate of cascode transistor M1 is configured to receive a voltage (e.g., a bias voltage). Device 640 also includes a diode D5 coupled between the drain of cascode transistor M1 and a supply voltage $V_{DD}$. In this exemplary embodiment, a cathode of diode D5 is coupled to supply voltage and an anode of diode D5 is coupled to the drain of cascode transistor M1. Additionally, device 640 includes at least one circuit element 412 coupled between node N2 and an output pad 614. Accordingly, the drain of cascode transistor M1 of device 640 may not be directly coupled to output pad 614. It is noted that each of devices 600, 610, 620, 630, and 640 may include one or more bypass coupling capacitors and an LC load at an output, as disclosed above with reference to FIG. 2.

Figure 8:
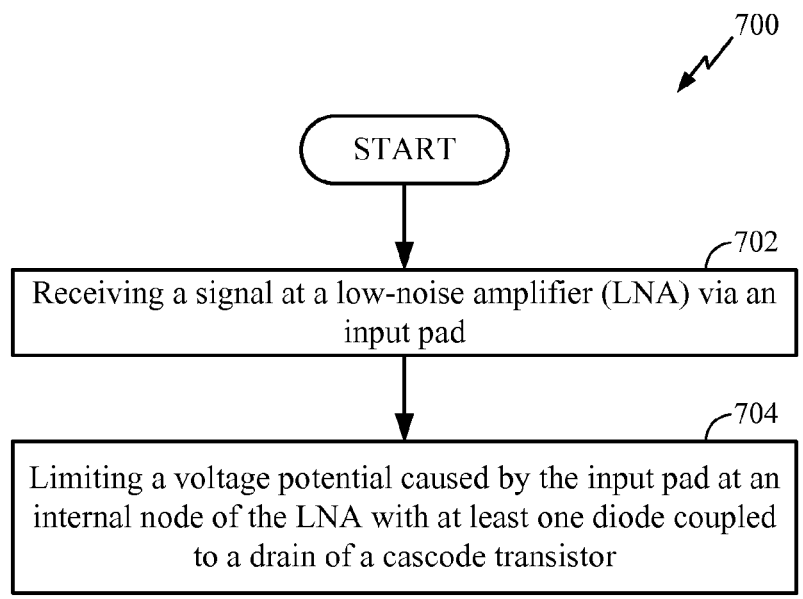
FIG. 8 is a flowchart illustrating a method, according to an exemplary embodiment of the present invention.

FIG. 8 is a flowchart illustrating a method 700, in accordance with one or more exemplary embodiments. Method 700 may include receiving a signal at a low-noise amplifier (LNA) via an input pad (depicted by numeral 702). Method 900 may also include limiting a voltage potential caused by the input pad at an internal node of the LNA with at least one diode coupled to a drain of a cascode transistor (depicted by numeral 704).

Figure 9:
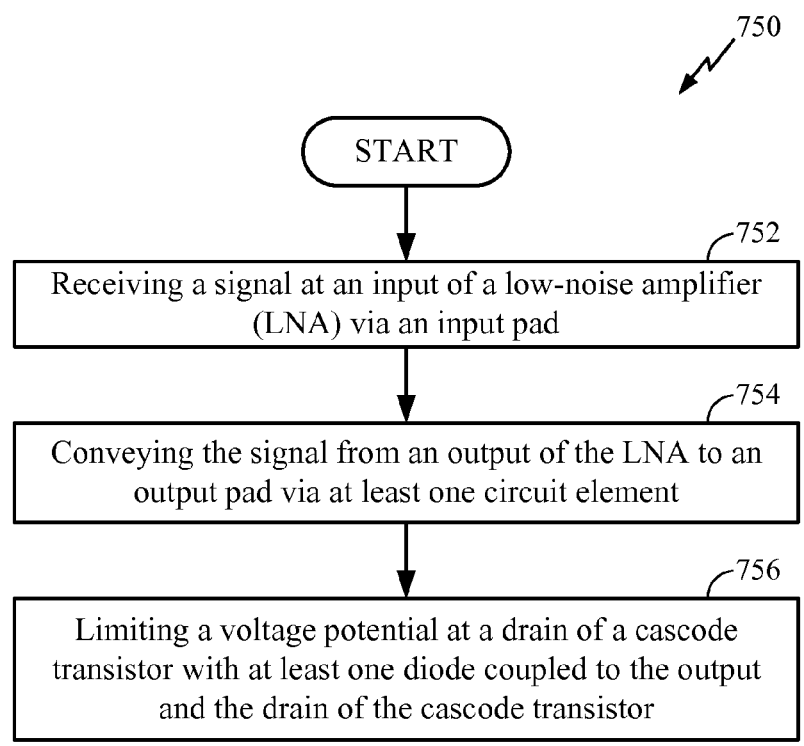
FIG. 9 is a flowchart illustrating another method, according to an exemplary embodiment of the present invention.

FIG. 9 is a flowchart illustrating another method 750, in accordance with one or more exemplary embodiments. Method 750 may include receiving a signal at an input of a low-noise amplifier (LNA) via an input pad (depicted by numeral 752). Method 950 may also include conveying the signal from an output of the LNA to an output pad via at least one circuit element (depicted by numeral 754). Further, method 750 may include limiting a voltage potential at a drain of a cascode transistor with at least one diode coupled to the output and the drain of the cascode transistor (depicted by numeral 756).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:
1. An amplifier, comprising:
a transistor configured to receive a bias voltage;
at least one circuit element coupled in a stack to the transistor and configured to receive an input voltage via an input pad; and at least one diode coupled to a drain of the transistor and configured to limit a voltage potential at the drain of the transistor caused by an electrostatic discharge (ESD) event at the input pad coupled to the at least one circuit element, the at least one diode configured based on the bias voltage to non-conduct during normal operation of the amplifier and conduct during the ESD event at the input pad.

2. The amplifier of claim 1, the at least one diode coupled between one of a gate and the drain of the transistor, the drain of the transistor and a supply voltage, and the drain of the transistor and a reference voltage.

3. The amplifier of claim 1, the at least one diode having a cathode coupled to a gate of the transistor and an anode coupled to the drain of the transistor and an output.

4. An amplifier, comprising:
a transistor configured to receive a bias voltage;
at least one circuit element coupled in a stack to the transistor and configured to receive an input voltage via an input pad; and
at least one diode coupled to a drain of the transistor and configured to limit a voltage potential at the drain of the transistor caused by an electrostatic discharge (ESD) event at the input pad coupled to the at least one circuit element, the at least one diode comprising a first diode having a cathode coupled to a gate of the transistor and a second diode having a cathode coupled to an anode of the first diode and an anode coupled to the drain of the transistor.

5. The amplifier of claim 1, the at least one diode having an anode coupled to a gate of the transistor and a cathode coupled to the drain of the transistor.

6. A device, comprising:
a first transistor configured to receive a bias voltage;
a second transistor coupled between the first transistor and a reference voltage; at least one circuit element coupled in a stack to a drain of the first transistor and configured for coupling to an output pad; and
at least one diode coupled to the drain of the first transistor and configured to provide electrostatic discharge (ESD) protection at the drain of the first transistor caused by an ESD event at an input pad coupled to the second transistor, the at least one diode configured based on the bias voltage to non-conduct during normal operation of the device and conduct during the ESD event at the input pad.

7. The device of claim 6, the at least one diode coupled between one of a gate and the drain of the first transistor, the drain of the first transistor and a supply voltage, and the drain of the first transistor and the reference voltage.

8. The device of claim 6, the at least one diode having a cathode coupled to a gate of the first transistor and an anode coupled to the drain of the first transistor and the at least one circuit element.

9. A device, comprising:
a first transistor;
a second transistor coupled between the first transistor and a reference voltage;
at least one circuit element coupled in a stack to a drain of the first transistor and configured for coupling to an output pad; and
at least one diode coupled to the drain of the first transistor and configured to provide electrostatic discharge (ESD) protection at the drain of the first transistor caused by an ESD event at an input pad coupled to the second transistor, the at least one diode comprising a first diode having a cathode coupled to a gate of the first transistor and a second diode having a cathode coupled to an anode of the first diode and an anode coupled to a drain of the first transistor.

10. The device of claim 6, the at least one diode having an anode coupled to a gate of the first transistor and a cathode coupled to a drain of the first transistor.

11. A device, comprising:
a first transistor;
a second transistor coupled between the first transistor and a reference voltage;
at least one circuit element coupled in a stack to a drain of the first transistor and configured for coupling to an output pad; and
at least one diode coupled to the drain of the first transistor and configured to provide electrostatic discharge (ESD) protection at the drain of the first transistor caused by an ESD event at an input pad coupled to the second transistor, the at least one diode having an anode coupled to the reference voltage and a cathode coupled to the at least one circuit element.

12. A device, comprising:
a first transistor;
a second transistor coupled between the first transistor and a reference voltage;
at least one circuit element coupled in a stack to a drain of the first transistor and configured for coupling to an output pad; and
at least one diode coupled to the drain of the first transistor and configured to provide electrostatic discharge (ESD) protection at the drain of the first transistor caused by an ESD event at an input pad coupled to the second transistor, the at least one diode having an anode coupled to the drain of the first transistor and the at least one circuit element and a cathode coupled to a supply voltage.

13. A method, comprising:
receiving a signal at a low-noise amplifier (LNA), the LNA including a cascode transistor configured to receive a bias voltage and a first transistor configured to receive the signal via an input pad; and
limiting a voltage potential with at least one diode at a drain of the cascode transistor caused by an electro-static discharge (ESD) event at the input pad coupled to the first transistor, the at least one diode configured based on the bias voltage to non-conduct during normal operation of the LNA and conduct during the ESD event at the input pad.

14. The method of claim 13, the limiting comprising limiting the voltage potential with the at least one diode coupled between one of a gate and the drain of the cascode transistor, the drain of the cascode transistor and a supply voltage, and the drain of the cascode transistor and a reference voltage.

15. The method of claim 13, the limiting comprising limiting the voltage potential with a diode having an anode coupled to the drain of the cascode transistor and a cathode coupled to a gate of the cascode transistor.

16. The method of claim 13, the limiting comprising limiting the voltage potential with a first diode having a cathode coupled to a gate of the cascode transistor and a second diode having a cathode coupled to an anode of the first diode and an anode coupled to the drain of the cascode transistor.

17. The method of claim 13, the limiting comprising one of limiting the voltage potential with a diode having an cathode coupled to the drain of the cascode transistor and an anode coupled to a gate of the cascode transistor and limiting the voltage potential with a diode having a cathode coupled to the drain of the cascode transistor and an anode coupled to a ground voltage.

18. The method of claim 13, the limiting comprising limiting the voltage potential with a diode having an anode coupled to the drain of the cascode transistor and a cathode coupled to a supply voltage.

19. A method, comprising:
receiving a signal at an input of a first transistor in a low-noise amplifier (LNA) via an input pad, the LNA further including a cascode transistor configured to receive a bias voltage;
conveying the signal from an output of the LNA to an output pad via at least one circuit element; and
limiting a voltage potential with at least one diode at a drain of the cascode transistor in the LNA caused by an electrostatic discharge (ESD) event at the input pad coupled to the first transistor, the at least one diode configured based on the bias voltage to non-conduct during normal operation of the LNA and conduct during the ESD event at the input pad.

20. The method of claim 19, the limiting comprising limiting the voltage potential with the at least one diode coupled between one of a gate and the drain of the cascode transistor, the drain of the cascode transistor and a supply voltage, and the drain of the cascode transistor and a reference voltage.

21. The method of claim 20, the limiting the voltage potential with the at least one diode comprising limiting the voltage potential with a plurality of diodes coupled between the gate and the drain of the cascode transistor.

22. The method of claim 19, the limiting comprising limiting the voltage potential with the at least one diode having an anode coupled to the drain of the cascode transistor and a cathode coupled to one of a gate of the cascode transistor and a supply voltage.

23. The method of claim 19, the conveying comprising conveying the signal from the output to an output pad via at least one of an inductor, a capacitor, a matching network, and a mixer.

24. A device, comprising:
means for receiving a signal at a low-noise amplifier (LNA), the LNA including a cascode transistor configured to receive a bias voltage and a first transistor configured to receive the signal via an input pad; and
means for limiting a voltage potential with at least one diode at a drain of the cascode transistor caused by an electro-static discharge (ESD) event at the input pad coupled to the first transistor, the at least one diode configured based on the bias voltage to non-conduct during normal operation of the LNA and conduct during the ESD event at the input pad.

25. A device, comprising:
means for receiving a signal at an input of a first transistor in a low-noise amplifier (LNA) via an input pad, the LNA further including a cascode transistor configured to receive a bias voltage;
means for conveying the signal from an output of the LNA to an output pad via at least one circuit element; and
means for limiting a voltage potential with at least one diode at a drain of the cascode transistor in the LNA caused by an electrostatic discharge (ESD) event at the input pad coupled to the first transistor, the at least one diode configured based on the bias voltage to non-conduct during normal operation of the LNA and conduct during the ESD event at the input pad.

* * * * *